US006954711B2

(12) United States Patent
Beinglass et al.

(10) Patent No.: US 6,954,711 B2
(45) Date of Patent: Oct. 11, 2005

(54) TEST SUBSTRATE RECLAMATION METHOD AND APPARATUS

(75) Inventors: Israel Beinglass, Sunnyvale, CA (US); Paul V. Miller, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/440,937

(22) Filed: May 19, 2003

(65) Prior Publication Data

US 2004/0236533 A1 Nov. 25, 2004

(51) Int. Cl.$^7$ .......................... G06F 19/00; H01L 21/00
(52) U.S. Cl. .................. 702/120; 702/123; 700/116; 700/121; 438/13
(58) Field of Search .......................... 702/81–84, 108, 702/117–123, 182, 187; 700/108, 109, 116, 121; 209/583; 438/13, 14; 134/18, 42, 1.3

(56) References Cited

U.S. PATENT DOCUMENTS

| | | | |
|---|---|---|---|
| 3,583,561 A | | 6/1971 | Wiesler et al. ............... 209/546 |
| 4,510,673 A | * | 4/1985 | Shils et al. .................... 438/15 |
| 4,637,123 A | | 1/1987 | Cazcarra et al. .............. 438/14 |
| 5,432,702 A | * | 7/1995 | Barnett ........................ 700/116 |
| 5,654,204 A | | 8/1997 | Anderson ..................... 438/15 |
| 5,751,581 A | | 5/1998 | Tau et al. .................... 700/115 |

(Continued)

FOREIGN PATENT DOCUMENTS

| | | | | | |
|---|---|---|---|---|---|
| JP | 11121577 A | * | 4/1999 | ........... | B65G/49/07 |
| JP | 2000206480 A | * | 7/2000 | ............. | G02F/1/13 |

OTHER PUBLICATIONS

Popovich, S. B., "Implementation of a Test Wafer Inventory Tracking System to Increase Efficiency in Monitor Wafer Usage", 1997 Advanced Semiconductor Manufacturing Conference and Workshop, 1997. pp. 440–443.*

Primary Examiner—Marc S. Hoff
Assistant Examiner—Manuel L. Barbee
(74) Attorney, Agent, or Firm—Konrad Raynes Victor & Mann, LLP

(57) ABSTRACT

Test substrates used to test semiconductor fabrication tools are reclaimed by reading from a database the process steps performed on each test substrate and selecting a reclamation process from a plurality of reclamation processes, for reclaiming each test substrate. Information identifying the processes performed on each test substrate and the reclamation process selected for each test substrate, may be stored in a test substrate history database. Each test substrate is sorted and placed into a group of test substrates having a common reclamation process assigned to the test substrates of the group. The bins in which the sorted test substrates are stored are each labeled with identifying information including basic or detailed information on the reclamation process selected for the test substrates stored in the bin. The information may also include a list of the test substrates stored in each bin. Information identifying the test substrates stored in each bin and the reclamation process selected for those test substrates may also be stored in a database for those bins. The sorted test substrates may be removed from the bins by a reclamation operator in an automated system in which an identification code is read from each test substrate by a suitable reader. The reclamation process assigned to each test substrate can be read from a database supplied to the operator to verify which reclamation process was assigned to each test substrate prior to reclaiming the test substrate.

38 Claims, 11 Drawing Sheets

U.S. PATENT DOCUMENTS

| | | | |
|---|---|---|---|
| 5,805,472 A | 9/1998 | Fukasawa | 702/118 |
| 5,889,674 A | 3/1999 | Burdick et al. | 700/121 |
| 5,949,584 A * | 9/1999 | White et al. | 359/633 |
| 5,966,459 A | 10/1999 | Chen et al. | 382/149 |
| 5,999,003 A | 12/1999 | Steffan et al. | 324/537 |
| 6,203,617 B1 * | 3/2001 | Tanoue et al. | 118/695 |
| 6,265,683 B1 | 7/2001 | Flottmann et al. | 209/576 |
| 6,265,684 B1 * | 7/2001 | Wu | 209/583 |
| 6,303,398 B1 | 10/2001 | Goerigk | 438/14 |
| 6,305,548 B1 | 10/2001 | Sato et al. | 209/3.3 |
| 6,363,382 B1 | 3/2002 | Kotani et al. | 707/7 |
| 6,408,219 B2 | 6/2002 | Lamey, Jr. et al. | 700/110 |
| 6,427,092 B1 | 7/2002 | Jones et al. | 700/121 |
| 6,431,814 B1 | 8/2002 | Christensen et al. | 702/81 |
| 6,449,522 B1 | 9/2002 | Conboy et al. | 700/121 |
| 6,470,231 B1 | 10/2002 | Yang et al. | 700/121 |
| 6,473,665 B2 | 10/2002 | Mugibayashi et al. | 700/110 |
| 6,500,261 B1 * | 12/2002 | Chen et al. | 118/500 |
| 6,504,123 B2 | 1/2003 | Beffa | 209/573 |
| 2001/0014884 A1 * | 8/2001 | Dillard et al. | 705/57 |
| 2002/0063085 A1 | 5/2002 | Casper | 714/724 |
| 2002/0071750 A1 * | 6/2002 | Nering | 414/416.03 |
| 2002/0082740 A1 | 6/2002 | Akram et al. | 700/121 |
| 2003/0005377 A1 | 1/2003 | Debenham | 209/573 |
| 2004/0002784 A1 * | 1/2004 | Yoshida et al. | 700/108 |

* cited by examiner

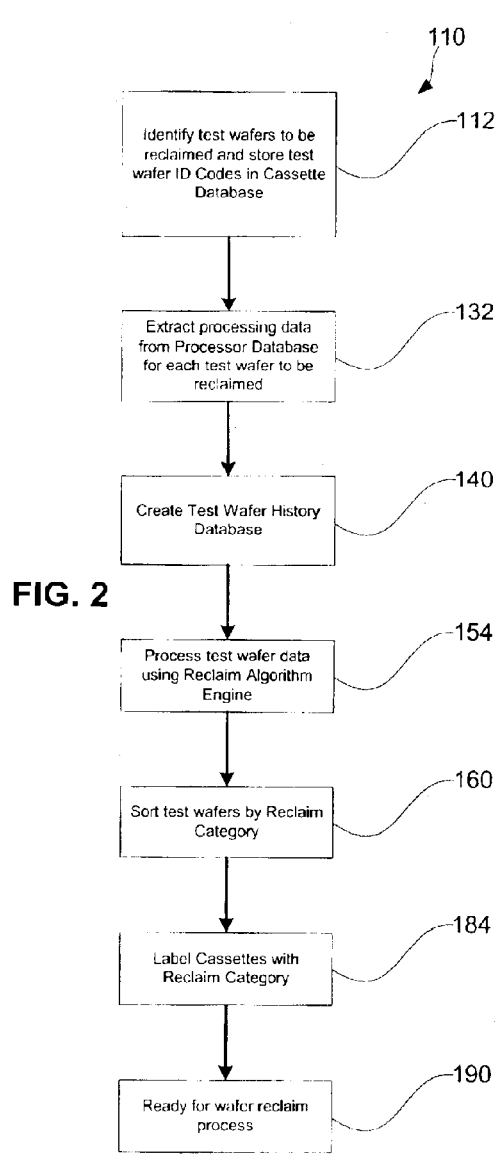
FIG. 2
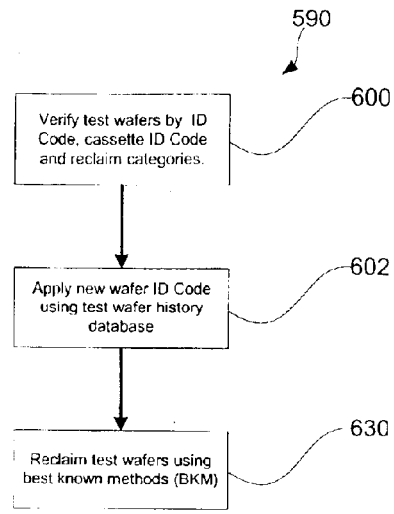
FIG. 13
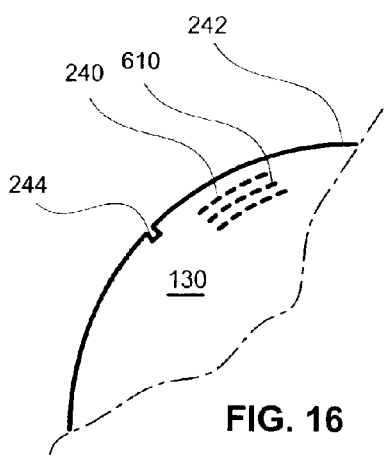
FIG. 16
612    614    616    618
Cu    XXYY   ZZ/ZZ/ZZ  1298723947
FIG. 17

Wafer ID Report

Cassette ID Code    Cassette ID Code

Slot 1 ---- Wafer ID Code    Slot 1 ---- Wafer ID Code
Slot 2 ---- Wafer ID Code    Slot 2 ---- Wafer ID Code
Slot 3 ---- Wafer ID Code    Slot 3 ---- Wafer ID Code
Slot 4 ---- Wafer ID Code    Slot 4 ---- Wafer ID Code
     .                              .
Slot n ---- Wafer ID Code    Slot n ---- Wafer ID Code

Cassette ID Code    Cassette ID Code

Slot 1 ---- Wafer ID Code    Slot 1 ---- Wafer ID Code
Slot 2 ---- Wafer ID Code    Slot 2 ---- Wafer ID Code
Slot 3 ---- Wafer ID Code    Slot 3 ---- Wafer ID Code
Slot 4 ---- Wafer ID Code    Slot 4 ---- Wafer ID Code
     .                              .
Slot n ---- Wafer ID Code    Slot n ---- Wafer ID Code

Cassette No. 127563    Oxide Strip Process No. 5a

Date    Customer ID
Sorting Company    Reclaim Supplier

Test Wafer Manifest:

| 1. 34565 | 6. 34265 | 11. 44565 | 16. 347765 | 21. 94565 |
| 2. 937 | 7. 937 | 12. 385537 | 17. 75937 | 22. 7597 |
| 3. 86739 | 8. 7739 | 13. 48673 | 18. 416739 | 23. 48839 |
| 4. 385 | 9. 85325 | 14. 45385 | 19. 45385 | 24. 45585 |
| 5. 49305 | 10. 9325 | 15. 449305 | 20. 49301 | 25. 4905 |

FIG. 12

TEST SUBSTRATE RECLAMATION METHOD AND APPARATUS

FIELD OF THE INVENTION

The invention relates to reclamation of test substrates used to test semiconductor fabrication equipment.

DESCRIPTION OF THE RELATED ART

In the course of fabricating semiconductor devices, various materials may be deposited onto a semiconductor wafer or other substrate. These materials may include metals such as copper, aluminum, tungsten, tantalum as well as a variety of other metals and compounds. Other materials deposited onto wafers include silicon and various oxides and other nonmetallic materials. These materials may be deposited using a variety of techniques including sputtering (also referred to as physical vapor deposition or PVD), chemical vapor deposition (CVD) and thermal growth. In addition to depositing materials, other fabrication processes may be performed including doping semiconductor layers with impurities, diffusion, ion implantation, etching, chemical and mechanical polishing (CMP), cleaning and heat treatments.

In order to test these fabrication processes, test wafers are often used to ensure that the processes are operating within the appropriate specifications. Thus, to test a copper sputtering process, for example, a test wafer may be placed into a copper sputtering tool and copper sputter deposited onto the test wafer. The test wafer may then be inspected to verify whether or not the resultant deposited copper layer is within specification. If not, the controls to the copper sputtering tool may be adjusted and the tool retested with the same or another test wafer until the desired copper deposition layer is reliably achieved.

Rather than discard the used test wafers after they are no longer usable for further testing, the used test wafers can be reclaimed. The reclamation process typically includes removing all the deposited layers and materials and removing some of the underlying silicon material so that the remaining silicon material of the test wafer is clean and substantially free of added materials or other contaminants. As a consequence, the reclamation process is intended to restore the test wafer to meet the same specifications as a new test wafer except for its thickness.

In order to avoid contamination, it is often preferred that test wafers upon which copper has been deposited be reclaimed separately from other test wafers having no copper depositions. In a similar manner, it is often preferred that test wafers having metal depositions be reclaimed separately from test wafers having only nonmetal depositions.

To achieve this, used test wafers destined for reclamation are often sorted into one of a few reclamation categories and then stored in cassettes. Notes may be jotted onto each cassette label indicating the particular category (such as "copper", "metal" or "nonmetal") to which the test wafers in the cassette is believed to belong. The test wafers may then be transferred to an in-house reclamation service operator or shipped to an outside service provider. The test wafers are often shipped or transferred in bulk, that is, hundreds or thousands at a time.

The reclamation service operator, upon receipt of the test wafers, takes note of any notices written on the cassette labels, removes the test wafers from the cassettes, visually inspects the test wafers and sorts them by reclamation category, again, typically the "copper", "metal" or "nonmetal" categories. The test wafers of each category are then processed using a reclamation process appropriate for that particular category.

SUMMARY OF THE ILLUSTRATED EMBODIMENTS

In accordance with certain aspects of the present invention, test substrates used to test semiconductor fabrication tools may be reclaimed by reading from a database the process steps performed on each of a plurality of test substrates and selecting a reclamation process from a plurality of reclamation processes, for reclaiming each test substrate. For example, where the process steps performed on the test substrates include material depositions, the data read from the database can include data representing the type of material deposited and the thickness of the deposited material in a process step. A reclamation process may then be selected for each test substrate which is appropriate for that test substrate depending upon the types of materials deposited on the test substrate and the thickness of each deposition. It is appreciated that reclamation processes may be selected based upon other processes performed on the test substrates including ion implantation, CMP, cleaning, thermal treatments and etching and the details concerning those processes. The information identifying for each test substrate, the processes performed on that test substrate and the reclamation process selected for that test substrate, may be stored in a test substrate history database.

In accordance with additional aspects, each test substrate for which a reclamation process has been selected may be sorted and placed into a group of test substrates having a common reclamation process assigned to the test substrates of the group. For example, the test substrates may be sorted in an automated system in which an identification code is read from each test substrate by a scanner or other suitable reader, the reclamation process assigned to that test substrate is read from a database and the test wafer is placed by a robot or other automated substrate handlers in a cassette or other bin containing additional test substrates assigned with the same or similar reclamation process.

In accordance with further aspects, the bins in which the sorted test substrates are stored may each be labeled with identifying information including basic or detailed information on the reclamation process selected for the test substrates stored in the bin. The information may also include a list of the test substrates stored in each bin. The information identifying for each bin, the test substrates stored in the bin and the reclamation process selected for those test substrates may also be stored in a database for those bins.

In accordance with still further aspects, the sorted test substrates may be removed from the bins by a reclamation operator in an automated system in which an identification code is read from each test substrate by a suitable reader. The reclamation process assigned to that test substrate can be read from a database supplied to the operator to verify which reclamation process was assigned to each test substrate prior to reclaiming the test substrate.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

BRIEF DESCRIPTION OF THE DRAWINGS

FIG. 2 is a flow chart representing the overall reclaim preparation process.

FIG. 8 is an example of a report for test wafers and cassettes.

FIG. 12 is an example of a recycle cassette label.

FIG. 13 is a flow chart representing the overall reclaim process.

FIG. 16 depicts identification codes placed on a test wafer.

FIG. 17 illustrates an example of an identification code for a test wafer which reflects the processing history of the test wafer.

DETAILED DESCRIPTION OF ILLUSTRATED EMBODIMENTS

Figure 1:
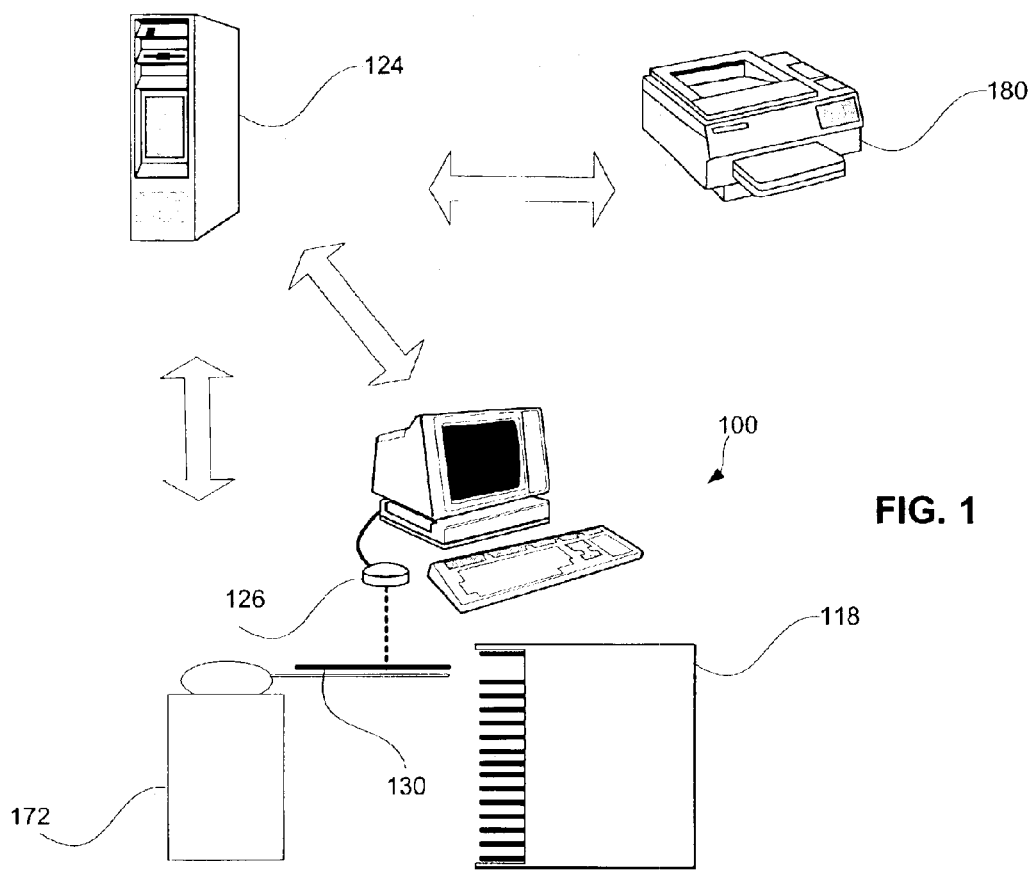
FIG. 1 is a schematic diagram of the overall system.

FIG. 1 illustrates one example of a computerized system 100 which is believed capable of significantly enhancing reclamation of used test wafers and other test substrates used in the fabrication of semiconductor devices. The system 100 is used in a reclamation preparation process, an example of which is summarized in FIG. 2. In the reclamation preparation process 110, the test wafers to be reclaimed are identified (block 112) by the system 100 and stored into cassettes 118, each of which is preferably assigned a unique identification code which may include alphanumeric or other symbols. Although the illustrated system is described in connection with silicon test wafers and cassettes, it is appreciated that certain embodiments may be directed to other types of test semiconductor and non-semiconductor substrates including silicon on insulator (SOI), gallium arsenide, germanium, silicon germanium, glass and other test substrates. Also, it is appreciated that storage containers or bins other than cassettes may be used. One example is a FOUP used to transport 300 mm wafers.

Figures 3, 14:
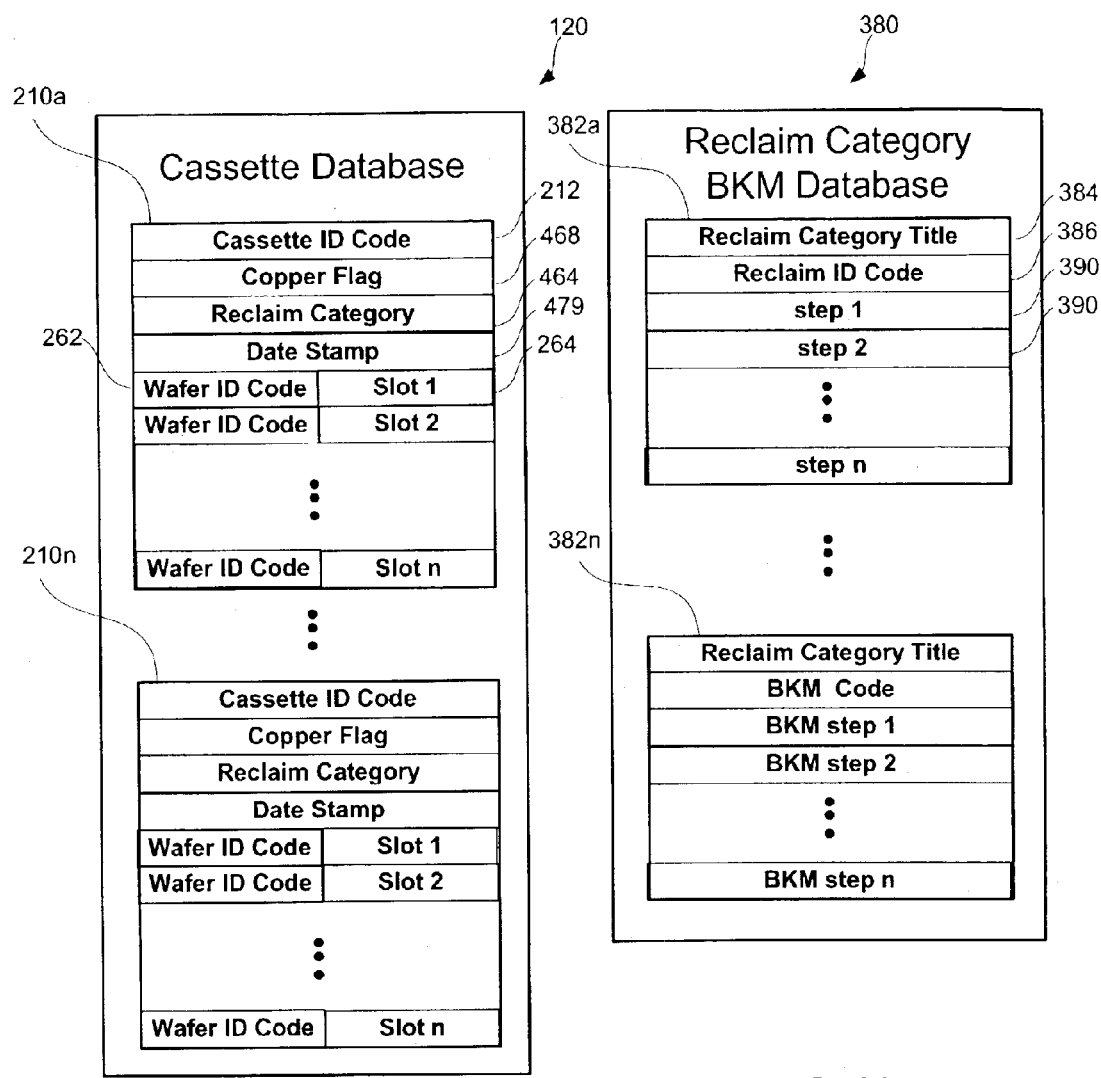
FIG. 3 is a schematic diagram of a recycle cassette database.
FIG. 14 is a schematic diagram of a best known method (BKM) database.

FIG. 3 is a schematic representation of one example of a computer database 120 in which the system 100 stores the identification code of each test wafer to be reclaimed and the identification code of the particular cassette 118 in which each such test wafer is stored. The system 100 includes a suitable computer or computer network 124 (FIG. 1) which maintains the cassette database 120. A reader 126 reads the identification code from each test wafer 130 to be reclaimed, for storage in the database 120.

Figure 4:
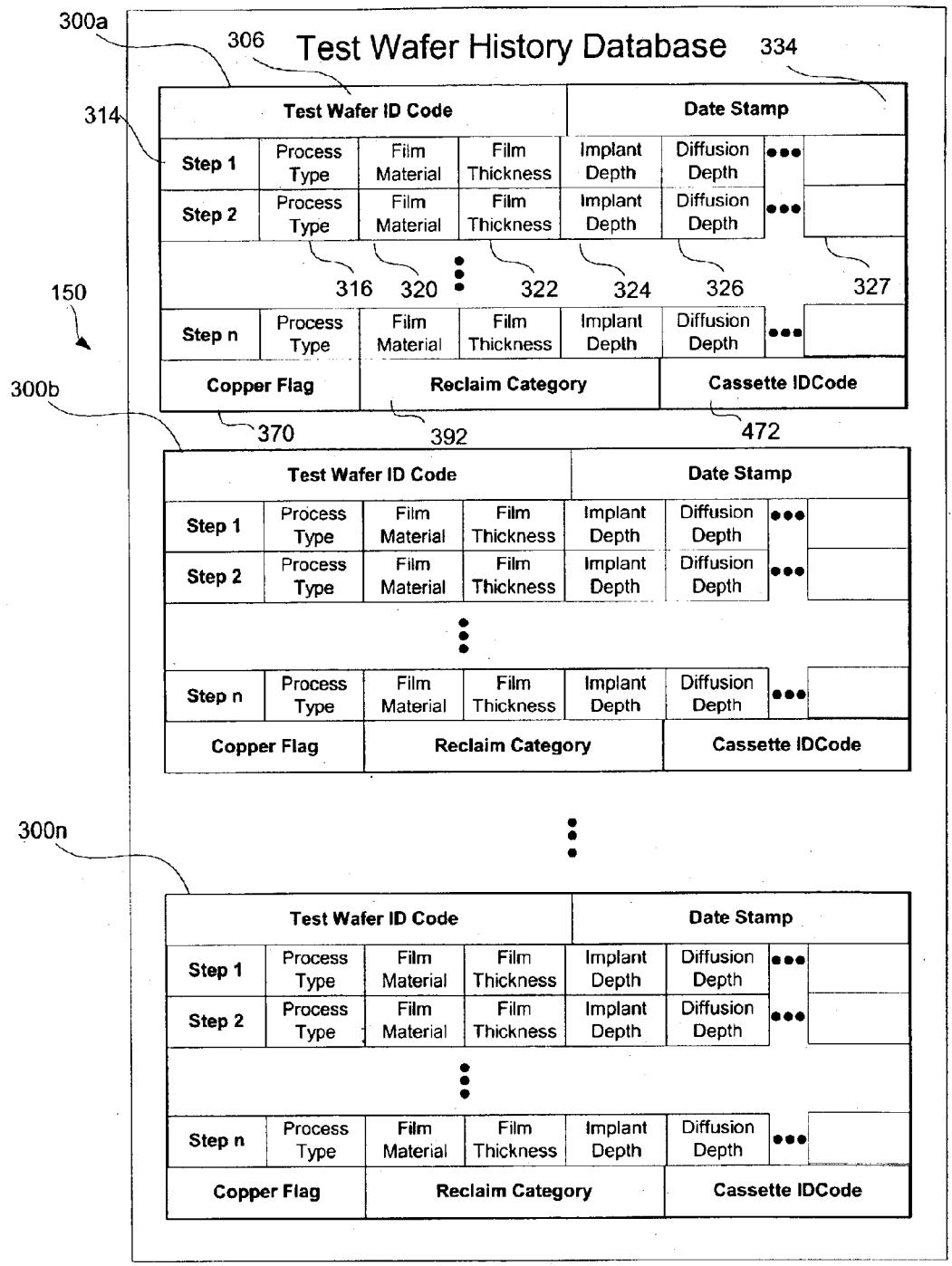
FIG. 4 is a schematic diagram of the test wafer history database.

In accordance with another aspect of the illustrated reclamation process 110, the system 100 also extracts (block 132, FIG. 2) the processing history of each test wafer to be reclaimed. This processing history may include data describing the various layers, if any, deposited onto the test wafer and other processes performed on the test wafers including, etching, cleaning, polishing etc. In many semiconductor fabrication facilities, databases are frequently maintained which track the processes performed on each wafer passing through the fabrication system. Accordingly, this processing history data may be extracted from preexisting databases by the system 100 and stored (block 132) in a test wafer history database created (block 140, FIG. 2) by the system 100 for each test wafer identified as being prepared for reclamation. FIG. 4 shows an example of such a test history database 150 in which each of the processing steps performed on a test wafer is stored in association with the identification code of the particular test wafer.

Using the test wafer history database 150, the system 100 can examine (block 154, FIG. 2) each of the processing steps performed on a particular test wafer and determine which of a plurality of methods for reclaiming that particular test wafer would be suitable. For example, if a test wafer has a 500 Angstrom layer of oxide deposited upon it, that test wafer may require less chemical stripping than another test wafer having a 1000 Angstrom layer of oxide deposited on it. It is appreciated that the test wafers may be more efficiently reclaimed by utilizing a database such as the test wafer history database 150 to select a reclamation method particularly suited for that particular test wafer. In the illustrated embodiment, the system 100 includes a reclaim algorithm engine which identifies a method for reclaiming each test wafer based upon the detailed processing history of that test wafer, and stores data identifying that selected method in one or more of the databases 120 and 150 of the system 100.

Figure 5:
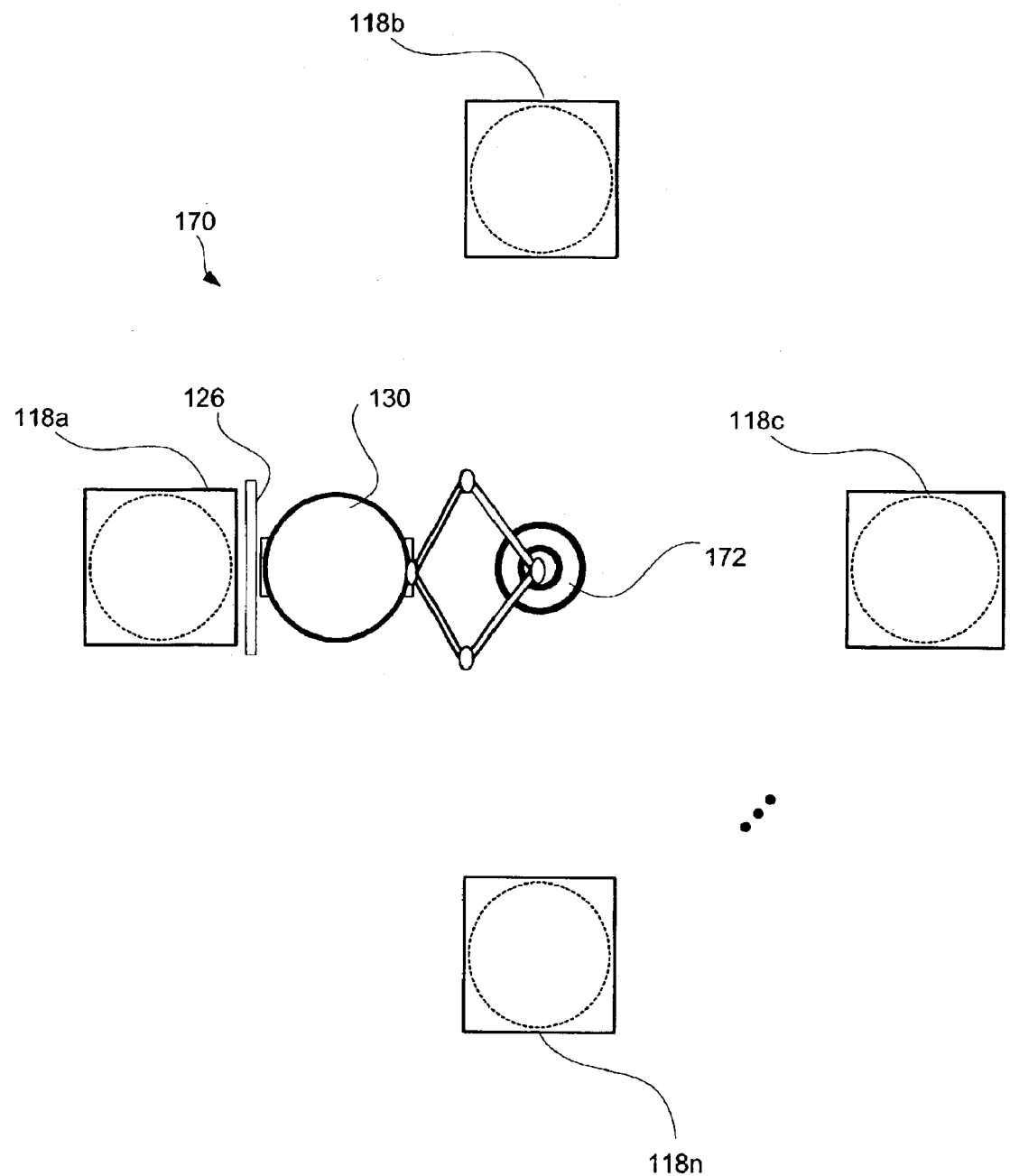
FIG. 5 is a schematic diagram of a test wafer sorting apparatus.

Once the appropriate reclaiming methods have been identified for one or more test wafers, that information may be used by the system 100 to sort (block 160, FIG. 2) test wafers into various categories, on the basis of the method selected for each test wafer. FIG. 5 shows an example of a robotic system 170 of the system 100, which includes a robot 172 capable of removing a test wafer 130 from any of a plurality of storage cassettes or other storage bins 118a, 118b, 118c . . . 118n and storing the test wafer into any of the other storage cassettes 118a, 118b, . . . 118n. In the illustrated embodiment, positioned one or more bins is an optical scanner or other type of reader 126 which permits the test wafer to be scanned as it is withdrawn from or inserted into the associated cassette to verify the test wafer identification code of the test wafer being handled by the robot 172.

Figure 6:
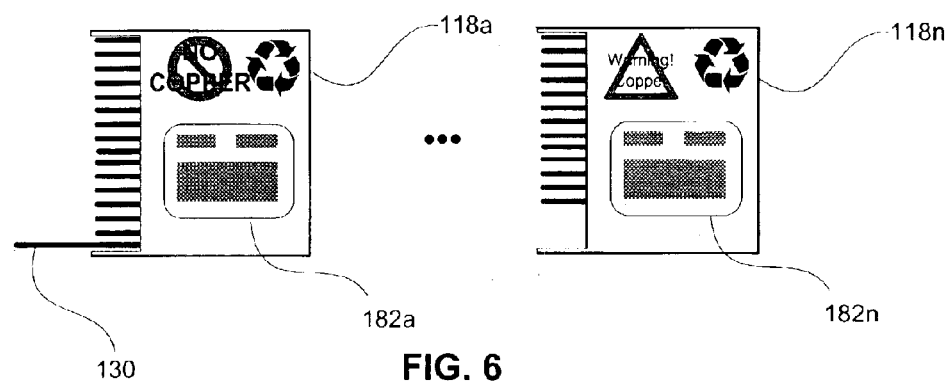
FIG. 6 illustrates examples of recycle cassettes with a printed label attached.

In one example, all the test wafers which have been assigned one particular reclamation method or category may be stored in one cassette up to the capacity of that cassette. The system 100 includes a printer 180 (FIG. 1) to print a label 182a . . . 182n (FIG. 6) for each cassette 118a, 118n, respectively. Each label may be attached (block 184, FIG. 2) to the associated cassette and may identify by identification codes, each test wafer stored in the cassette by the robotic sorting system 170 and the particular reclamation method selected by the reclamation algorithm engine for each of the test wafers in the cassette, as well as other information as described below. The test wafers of each cassette are then ready (block 190, FIG. 2) to proceed to be reclaimed using the reclamation process identified by the label attached to the cassette storing the test wafers.

Figure 7:
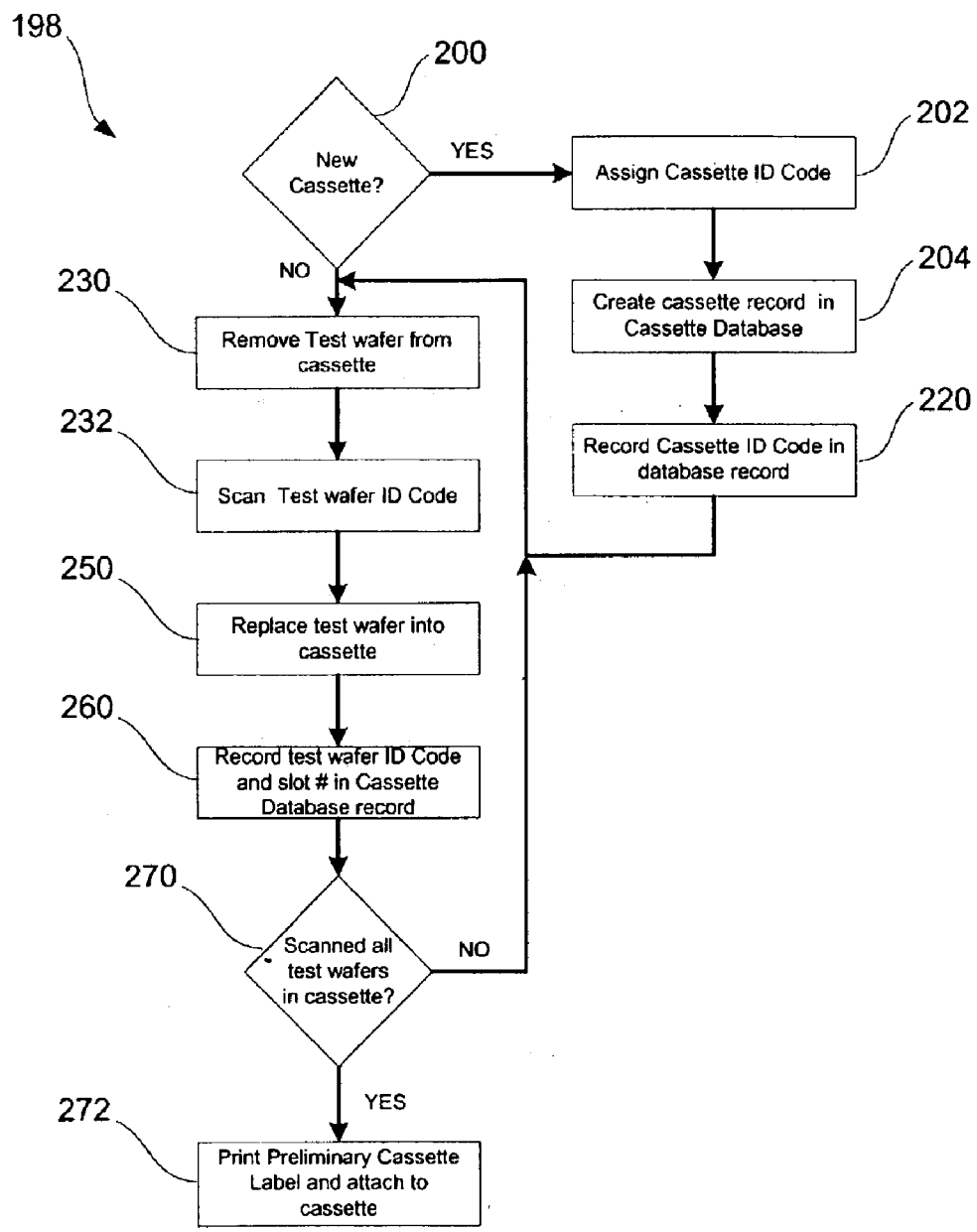
FIG. 7 is a flow chart representing steps to map test wafers and cassettes.

FIG. 7 shows in greater detail operations 198 which may be performed to identify (block 112, FIG. 2) the test wafers to be reclaimed and the cassettes in which the test wafers are stored. If (block 200) a new cassette of test wafers is to be identified, the cassette is assigned (block 202) a unique cassette identification code and a new record is created (block 204) in the cassette database 120. As shown in FIG. 3, the cassette database 120 has a record 210a ... 210n for each cassette 118a ... 118n, respectively. Each record has a field 212 in which the cassette identification code is stored (block 220, FIG. 7). In the illustrated embodiment, the cassette identification code may be a series of symbols including alphanumeric characters and other arbitrary symbols which uniquely identify a particular cassette.

Once a record has been created in the cassette database 120 for the cassette being processed and the identification code of the cassette has been stored in the appropriate field 212, or if (block 200) the cassette already has an associated record in the cassette database 120, the robot 172 removes (block 230) a test wafer from the cassette, a scanner 126 scans (block 232) the test wafer to read the test wafer identification code. Like the cassette identification code, the wafer identification code may be a series of symbols including alphanumeric characters and other symbols which uniquely identify a particular test wafer. These test wafer identification codes are often inscribed directly onto the front or back surfaces of the test wafer, often using lasers.

FIG. 16 shows an example of a test wafer identification code 240 laser scribed near the edge 242 of a test wafer 130. Test wafers often have a notch 244, or flattened edge (not shown) or other orientation features which facilitate robotic handling. The test wafer identification code 240 is preferably of a type readily discernible by optical scanners or other reading devices to facilitate automated handling of the wafers.

Once the identification code of the wafer has been read, the test wafer may be replaced (block 250, FIG. 7) into the same or a different cassette. In addition, the test wafer identification code read from the test wafer is stored (block 260) into the cassette database 120 in a field 262 (FIG. 3) of the record associated with the particular cassette into which the test wafer is placed. Many cassettes or other storage bins often have slots which support each individual wafer. These slots are often uniquely identified by individual slot numbers. In this example, each cassette has a plurality of slots, numbered slot 1, slot 2 ... slot n. Accordingly, the slot number slot 1, slot 2 ... slot n of the slot in which the test wafer is stored may be recorded (block 260) into a field 264 associated with the identification code of the test wafer stored in that slot.

Once all (block 270) of the test wafers of the cassette being processed have been scanned, a preliminary cassette label may be printed (block 272) by the printer 180 of the system 100 and attached to the cassette. This preliminary label may include information such as the cassette identification code and may also include a list by wafer identification codes, of the test wafers stored in the cassette for reclamation. The cassette and test wafer identification process of FIG. 7 may be repeated for all the cassettes of test wafers destined to be reclaimed.

The identification information for all these cassettes and test wafers may also be printed in a report an example of which is shown in FIG. 8. This report 280 could include a list of the cassettes containing test wafers to be reclaimed in which each cassette is identified by its unique cassette identification code and a list of the test wafers stored in each cassette. The information for each test wafer may include the test wafers identification code and the cassette slot number in which the test wafer is stored.

Figure 9:
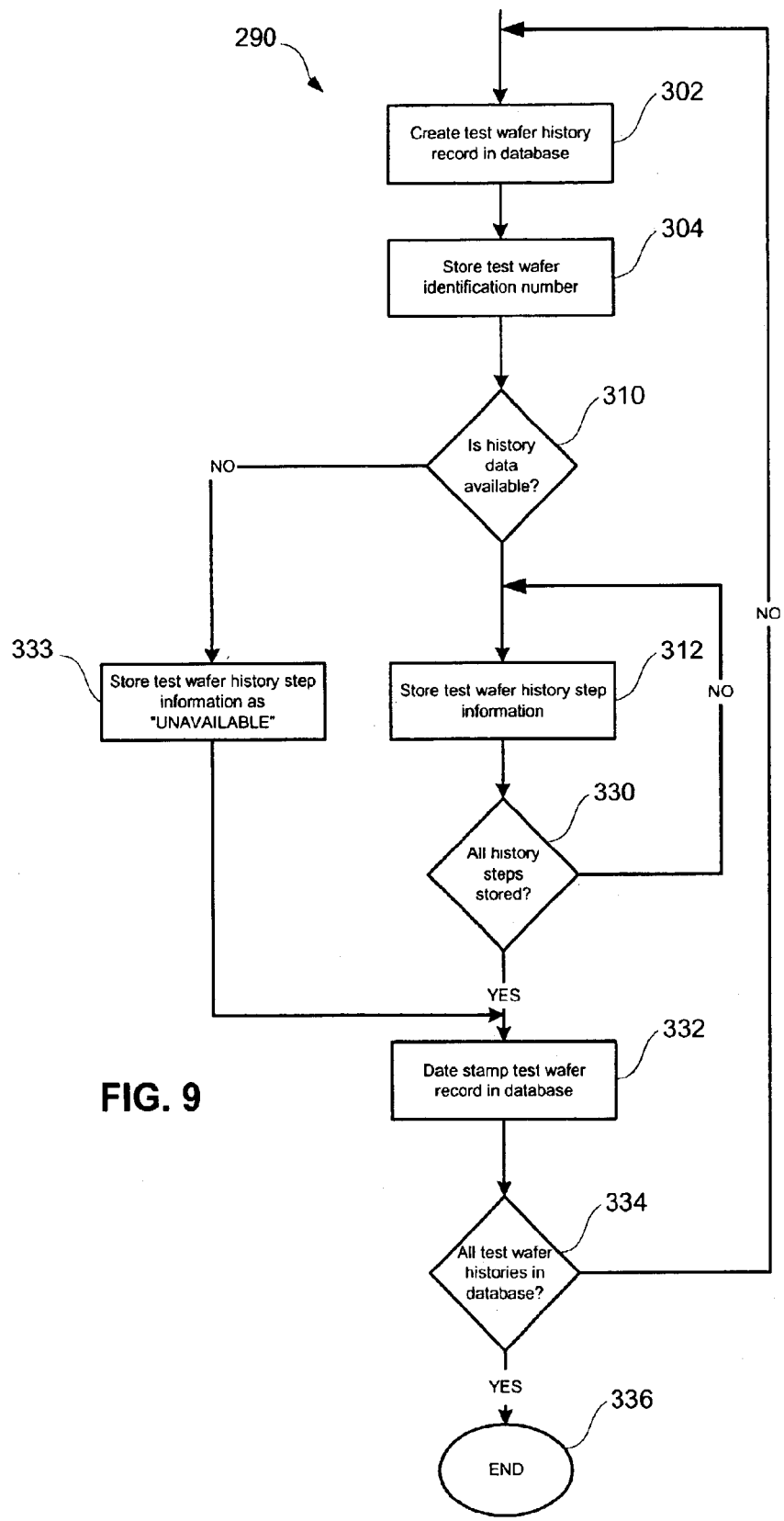
FIG. 9 is a flowchart representing steps to create the test wafer history database.

FIG. 9 shows in greater detail an example of operations 290 which may be performed to create (block 140, FIG. 2) a test wafer history database such as the database 150 illustrated in FIG. 4. The operations of FIG. 9 are preferably performed after one or more test wafers have been identified in a manner similar to that described above in connection with FIG. 7. Thus, test wafer history data may be stored in the test wafer history database 150 after each test wafer is identified by a reader or alternatively, data may be stored in the test wafer history data base for a batch of test wafers after that batch of test wafers has been identified by the operations of FIG. 7 for example.

To add test wafer history data to the test wafer database 150, a record such as record 300a (FIG. 4) is created (block 302, FIG. 9) for an individual test wafer and the identification code for that particular test wafer is stored (block 304) in a field 306. If history data is available (block 310) for that test wafer, data is stored (block 312) in the record 300 describing one or more processes performed on the test wafer. In the example of FIGS. 4 and 9), data is preferably stored for each fabrication processing step performed on the test wafer. This data may include a step number for each processing step which is stored in a field 314 to indicate the chronological order in which the various processing steps were performed on the test wafer. In addition, data identifying the type of process performed in each step may be stored in a field 316, for example. The various processes identified for a particular processing step may include, for example, CVD, PVD, thermal growth, doping, diffusion, ion implantation, etching, CMP, cleaning, heat treatments, defect inspections, etc. In addition, for each processing type, additional data may be stored in various fields. For example, for film deposition, the type of material (such as copper, aluminum, nitride, oxide, etc.) being deposited may be stored in a field 320 and the thickness of the film (such as 0 (if none), or 500 Angstroms, 1000 Angstroms etc.) may be stored in another field 322. For ion implantation, the ion type could be stored in the field 320 or another field, and the implantation depth (such as 0 (if none), or 250 Angstroms, 1500 Angstroms etc.) could be stored in a field 324. For diffusion processes, the diffusion depth could be stored in a field 326. It is believed this type of information for these processes can be used by the system 100 to facilitate selection of an appropriate reclamation method for each test wafer in the database 150 as a function of the details of the processes performed on the particular test wafer. There is of course additional information which may be stored in additional fields such as field 327 for these and other types of processes for use in selecting the appropriate reclamation process.

As previously mentioned, in the example of FIGS. 4 and 9), data is preferably stored for each fabrication processing step performed on the test wafer. Hence, the history data storage (block 312) is continued until all history steps (block 330) have been stored in the database 150. The processing history data may be "date stamped" by storing (block 332) the date the processing history data was stored into the database 150 in a field 334. It is appreciated that processing history data may not be available for every test wafer to be reclaimed. If the processing history data is unavailable (block 310), the system 100 can proceed to store (block 333) a suitable indication such as "UNAVAILABLE" into an appropriate field of the record for that test wafer and proceed to the date stamp operation (block 332).

If the processing history data has been stored into the database 150 for all the test wafers (block 334) identified as being destined for reclamation, the system 100 can end (block 336) the test wafer history database storage operations and begin to determine the appropriate reclamation method for each test wafer of the database 150 as described below. If not, the operations of FIG. 9 may be repeated, creating (block 302) a record for each remaining test wafer and storing the test wafer processing history data for each remaining test wafer as described above.

Figure 10:
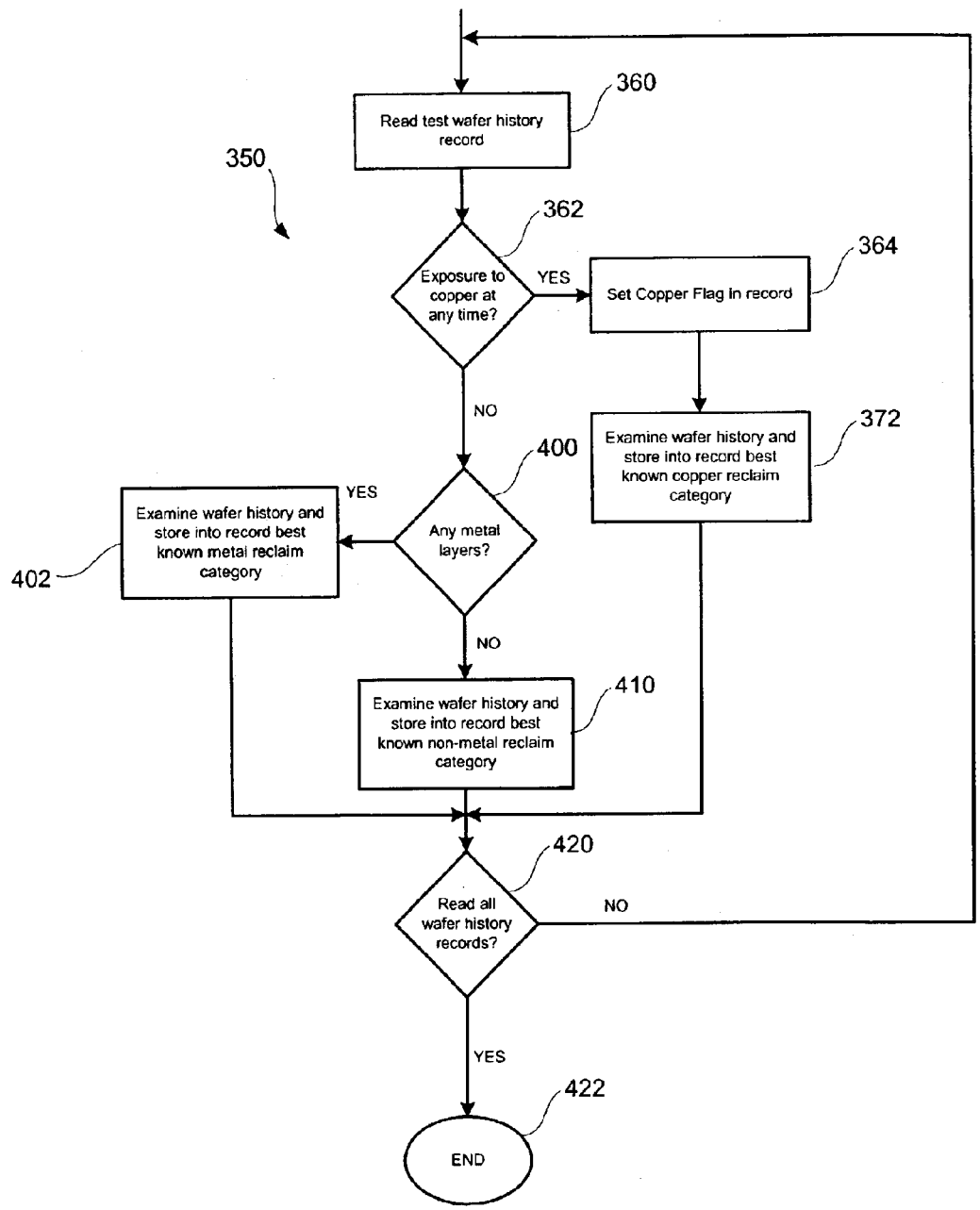
FIG. 10 is a flowchart representing steps of a reclaim algorithm engine.

FIG. 10 shows in greater detail an example of operations 350 which may be performed to process (block 154, FIG. 2) a test wafer history database such as the database 150 illustrated in FIG. 4, using a reclaim algorithm engine to identify the appropriate reclamation method for each test wafer of the database 150. The operations of FIG. 10 are preferably performed after one or more test wafers have been identified in a manner similar to that described above in connection with FIG. 7 and the processing history data has been stored in the database 150 for those test wafers. Thus, a reclamation method may be selected and stored in the test wafer history database 150 after a test wafer is identified by a reader or alternatively, reclamation methods may be selected and stored in the test wafer history data base for a batch of test wafers on an individual basis after the test wafers of the batch have been identified by the operations of FIG. 7 for example and the processing history data has been stored for each of the test wafers of the batch of test wafers by the operations of FIG. 9, for example.

To select a reclamation process for a test wafer, a record 300a, 300b . . . 300n in the test wafer history database 150 is read (block 360) for a particular test wafer. The records 300a, 300b . . . 300n may be processed in order or a particular record 300a, 300b . . . 300n selected for a particular test wafer. The record 300a, 300b . . . 300n which is read is examined (block 362) to determine whether the test wafer associated with that processing history database record was ever exposed to copper. If so, a copper flag is set (block 364) in a field 370 of the record for that test wafer. Flags may be provided for other types of materials and processes in the history of the test wafer. However, copper was selected for provision of a special flag in this example of FIG. 10 for selecting a reclamation process because copper if permitted to contaminate a processing tool not designed for copper deposition, can be particularly deleterious to that tool.

In this example, it is preferred that any test wafer which has been exposed to copper during any processing step as described in the test wafer history database 150, be segregated from noncopper exposed test wafers and receive special handling as result of its exposure to copper. In addition, the other relevant processing steps to which the test wafer has been subjected to as indicated by the test wafer's processing history, are examined (block 372) and an appropriate reclamation process is selected for that copper exposed test wafer as a function of that exposure to copper and the other processing steps of the test wafer history.

The system 100 preferably includes a database such as the database 380 of FIG. 14 in which detailed instructions may be stored for a large number of different reclamation processes. Thus, the database 380 may include for example, a record 382a . . . 382n for each reclamation process in which each record includes a title or other brief description of the reclamation process in a field 384, an identification code in a field 386, and a plurality of fields 390 which detail the various steps of the reclamation process. In this example, the reclamation processes could include a collection of the best known methods (BKM) for reclaiming a particular type of test wafer. It is further appreciated that the detailed processing history stored for each test wafer to be reclaimed readily permits the BKM reclamation methods to be modified to increase the efficiency of the reclamation processes.

For example, one BKM reclamation process for test wafers having no metal coatings may specify removing a fixed thickness from each test wafer to ensure that all of the coating is removed from all of the test wafers. However, as noted above, since the test wafer history database can store the actual thickness of the layer deposited onto each test wafer, the reclamation process for coated test wafers could be modified into several more specialized reclamation processes in which one reclamation process for coating removal removes only 500 Angstroms from test wafers having a deposition layer of less than 500 Angstroms and another specialized process removes 1000 Angstroms from wafers having a deposition greater than 500 Angstroms but less than 1000 Angstroms. As a consequence reclamation can be made more efficient. In addition, unnecessary removal of test wafer material can be reduced.

Still further, not only may the thickness of the deposition or depositions be noted in the test wafer history database for each test wafer but also the type of deposition of each deposited layer. Depending upon the type of material deposited, the removal method may be adjusted to accommodate both the thickness of the deposition and the deposition material. For example, an oxide layer could be removed with a simple chemical strip process such as a hydrofluoric acid strip. However, a photo resist layer may require a different type of chemical strip process such as a heated sulfuric acid bath.

Once a preferred reclamation process has been selected from the reclamation process database 380 for a particular test wafer, based upon the processing history stored in the database 150 for that test wafer, the identification code for the selected reclamation process is stored (block 372) in a field 392 of the record 300a . . . 300n of the database 150 associated with that particular test wafer.

If the test wafer was not exposed to copper (block 362), the record 300a, 300b . . . 300n which is read is examined (block 400) to determine whether any metal layers (other than copper) were deposited onto the test wafer associated with that processing history database record. In this example, it is preferred that any test wafer which has received metal depositions during any processing step as described in the test wafer history database 150 for that test wafer, be segregated from nonmetal test wafers for reclamation. For example, if a test wafer having a metal layer is introduced to a chemical stripping process intended to remove only nonmetal layers, that nonmetal stripping apparatus can become contaminated with metal which can in turn contaminate nonmetal test wafers with metal particles. Since deposited metal layers may be covered by subsequent nonmetal layer depositions, a test wafer having a buried metal deposition may not be readily identified by visual inspection. However, since all the relevant processing steps to which a test wafer has been subjected to as indicated by the test wafer's processing history, can be examined (block 400), buried metal depositions can be readily determined and an appropriate reclamation process can be selected for that test wafer based upon all relevant deposition steps (block 402) even if the metal depositions are covered up by nonmetal depositions.

Once a preferred reclamation process has been selected from the reclamation process database 380 for a test wafer having deposited metal, based upon the processing history stored in the database 150 for that test wafer, the identification code for the selected reclamation process is stored (block 402) in a field 392 of the record 300a . . . 300n of the database 150 associated with that particular test wafer.

If the test wafer was not exposed to copper (block 362) and has no metal depositions (block 400), the record 300a, 300b . . . 300n which is read is examined (block 410) to determine the appropriate reclamation process for the test wafer based upon all the relevant processing steps performed on that test wafer as indicated by the processing history database record for that test wafer. For example, the test wafer processing history database for a particular non-metal deposited test wafer may indicate that the test wafer has a simple film such as an oxide on the wafer which could be removed using only chemical stripping using hydrofluoric acid. This chemical strip may be followed by a cleaning process using established SC-1 and SC-2 chemistries and by a defect inspection process. By contrast, another test wafer may have more complicated non-metal depositions for which additional reclamation steps may be appropriate. Yet another non-metal test wafer may have undergone repeated chemical strip and clean processes but is unable to pass the defect inspection process. For such a test wafer, the reclamation process could include a short polish process followed by the cleaning and inspection processes. Hence, an appropriate reclamation process can be devised for each non-metal test wafer, adding, subtracting and substituting reclamation process steps as appropriate to increase the overall efficiency of the reclamation processes for all test wafers.

Once a preferred reclamation process has been selected from the reclamation process database 380 for a test wafer having no metal depositions, based upon the processing history stored in the database 150 for that test wafer, the identification code for the selected reclamation process is stored (block 410) in a field 392 of the record 300a . . . 300n of the database 150 associated with that particular test wafer. The reclaim algorithm engine of FIG. 10 continues examining each record of the test wafers identified for reclamation and selecting an appropriate reclamation process for each such test wafer and storing the reclamation process identification code into the associated record for that test wafer until all (blocks 420, 422) the test wafer history records have been processed.

Figure 11:
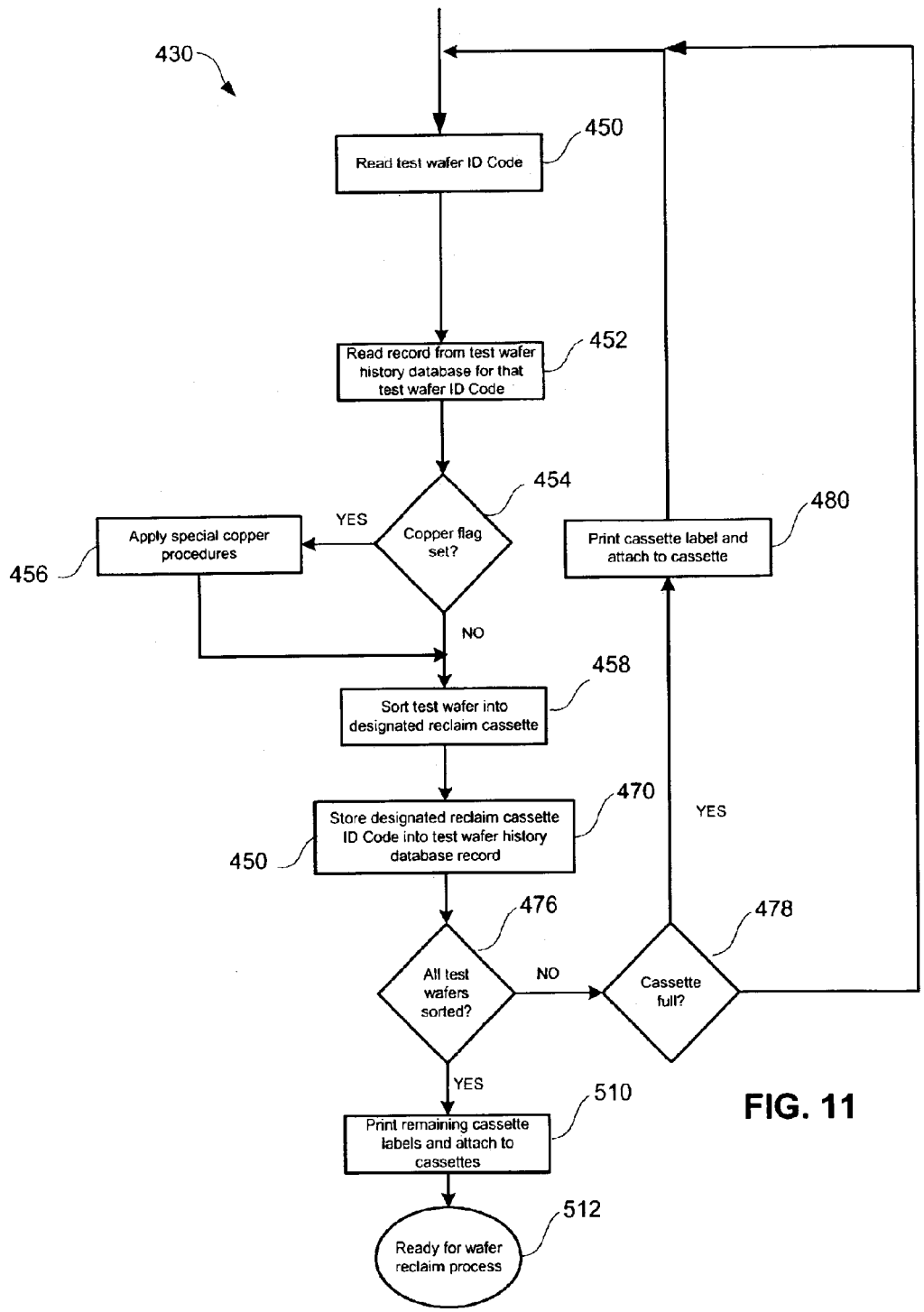
FIG. 11 is a flowchart representing steps of a process of sorting test wafers by reclaim category.

FIG. 11 shows in greater detail an example of operations 430 which may be performed to physically sort (block 160, FIG. 2) and segregate test wafers into categories using the reclamation methods identified and stored into the test history database 150 illustrated in FIG. 4. The operations of FIG. 11 are preferably performed after one or more test wafers have been identified in a manner similar to that described above in connection with FIG. 7, the test wafer processing history database examined and the appropriate reclamation process has been stored in the database 150 for those test wafers in a manner similar to that described above in connection with FIG. 10. A test wafer may be identified, a reclamation process selected for that test wafer and the test wafer may be sorted and segregated before processing the next test wafer. Alternatively, test wafers may be identified individually a batch at a time, reclamation processes may be selected for each test wafer of the batch a batch at a time and the test wafers subsequently sorted and segregated a batch at a time.

To sort the test wafers for reclamation, a test wafer may be withdrawn from a cassette or other storage bin 118a 118b, . . . 118n by an appropriate robot 172 (FIG. 5) and the identification code on that test wafer may be read (block 450, FIG. 11) by a suitable reader 126. Using the read identification code, the record 300a, 300b . . . 300n (FIG. 4) of the test wafer history database 150 is read (block 452) and the copper flag field 370 of that record is examined (block 454).

If the copper flag is set, indicating that the test wafer has been exposed to copper, the test wafer is segregated (block 456) away from other non-copper test wafers and special copper handling procedures are preferably employed. For example, it may appropriate in some applications to use separate robot handling systems so that copper and non-copper exposed test wafers are not handled by the same robotic systems. Should a copper exposed test wafer inadvertently be handled by a robotic system dedicated to handling non-copper exposed test wafers, the copper flag set for that copper exposed test wafer could be used by the system 100 to generate a warning indicator to the system operator so that the appropriate procedures could be employed. For example, the handling system could be shut down to permit the copper exposed wafer to be removed and handled by a handling system dedicated to copper exposed wafers. In addition, the non-copper handling system could be cleansed of any copper contamination before additional test wafers become copper contaminated. Also the test wafer history database could be updated for any test wafer which was exposed to the copper exposed test wafer to indicate that those test wafers were copper exposed as well and are to be handled by the system dedicated to handling copper exposed wafers.

If the copper flag of the record was not set (block 454) (or if the copper flag was set but the wafer handling system is intended to handle copper exposed test wafers), the test wafer is sorted by the robot 172 by placing (block 460) the test wafer into the appropriate reclaim cassette 118a . . . 118n or other storage bin. In one embodiment, each cassette 118a . . . 118n may be associated with one particular type of reclamation process. Thus, for example, one cassette may be used for storing oxide test wafers which will undergo a 500 Angstrom chemical strip and another cassette may be used for storing photo resist test wafers which will undergo a different chemical strip. Another cassette may container test wafers which require a polishing process and so on. In the illustrated embodiment, the identification code of the reclamation process intended for each cassette is stored in a field 464 (FIG. 3) of the cassette database record 210a . . . 210n associated with that particular cassette. In addition, if the cassette is intended to handle test wafers which have been exposed to copper, a copper flag 468 may be set in the cassette database record as well.

To identify the appropriate destination cassette 118a . . . 118n for a test wafer being handled by the robot 172, the identification code of the reclamation process selected for that test wafer is read from the field 392 of the test history database record for that test wafer and the identification code for the cassette which has been selected for that reclamation process is read from the cassette database 120. The robot 172 places the test wafer into an open slot of the cassette identified for that reclamation process. The identification code of the destination cassette into which the test wafer was placed may also be stored (block 470) in a field 472 of the test history database record 300a . . . 300n for that particular test wafer. Similarly, data identifying which cassette and which slot number of that cassette that the test wafer was placed may be stored into the cassette database 120. For example, the identification code of that test wafer may be stored in the appropriate record of the cassette database 120 for the destination cassette, in the appropriate test wafer identification code field 262 for the slot number field 264 of the slot of the destination cassette into which the test wafer was stored.

After placing the test wafer into the destination cassette 118a . . . 118n, an inquiry (block 476) may be made to determine if all of the test wafers destined for reclamation have been sorted. If not, an inquiry (block 478) may be made as to whether the last destination cassette is full of sorted test wafers. If so, the data in the database 120 for that cassette may be "date stamped" by storing the date the test wafer and reclamation data was stored into the database 120 for that cassette in a field 479.

In addition, a label may be printed (block 480) and attached to that cassette. FIG. 12 shows an example of such a cassette label 500. The cassette label 500 is preferably computer generated but may be generated in any suitable manner. The system 100 can print the label 500 such that the label 500 can include a variety of useful information. For example, the label 500 of FIG. 12 identifies the cassette identification code in a portion 502 and the reclamation process selected for each of the test wafers stored in the cassette is identified in a portion 504. The reclamation process may be identified by a description title or an identification code or both and could also include a description of the steps of the reclamation process. Other information which may be printed on the label 500 in a portion generally at 506 includes the date the test wafers were placed into the cassette, an identification of the owner of the test wafers or other customer information, an identification of the company which sorted the test wafers and an identification of the supplier intended to perform the reclamation process on the test wafers in the cassette. Still further, a list of all of the test wafers stored in the cassette may be listed on the face of the label 500 in another portion 508. This list may include the identification code of each test wafer and the slot number in which the test wafer is stored.

If all the test wafers have not been sorted, the robotic handling system can identify (block 450) another test wafer, sort it by reclamation process and place (blocks 452–470) it into the appropriate cassette for its reclamation process. Once all of the test wafers have been sorted (block 476), cassette labels may be printed (block 510) for all the remaining cassettes which have not yet been labeled in a manner similar to that described in FIG. 12 above. The cassettes containing the sorted test wafers and bearing the cassette labels are ready (block 512) to be processed in accordance with the reclamation process identified on each cassette label.

FIG. 13 illustrates generally at 590 operations which may be performed by the reclamation operator. In accordance with additional aspects, prior to actually performing the reclamation processes on the test wafers, a verification process (block 600) may be performed on the test wafers by the reclamation operator as indicated in FIG. 13. This verification may include verifying the test wafer identification codes, cassette identification codes and reclamation process identification codes as explained in greater detail in FIG. 15 discussed below.

Following verification, an additional identification code may be optionally inscribed (block 602) on each test wafer using some or all of the test history database 150. The information from the database 150 may be transmitted to the reclamation operator by a network connection, portable or removable media such as floppy disks or optical media or the Internet, for example. FIG. 16 shows an example of a test wafer 130 having a first identification code 240 which is typically inscribed by the wafer manufacturer. Using the test wafer history database, a second identification code 610 may be inscribed on the test wafer by the reclamation operator, for example. The second identification code, an example of which is illustrated in FIG. 17 could include a variety of alphanumeric characters and other symbols which are visible to the human eye or readable by machine vision or both. For example, the additional identification code could include identification symbols 612 of the reclamation process to which the test wafer is to be subjected or of a broad reclamation category such as "Cu" for copper, "NM" for no metal, or "MNC" for metal but no copper.

The second identification code 610 could also include a field 614 of symbols identifying the reclamation processor, a field 616 of symbols identifying the date the second identification code 610 was added or the date the reclamation process was performed, and a field 618 of symbols uniquely identifying the test wafer. The field 618 may be the same as the code 240 inscribed by the wafer manufacturer or a new test wafer identification code generated by the reclamation processor.

Following verification (block 600) of the wafer identity and the reclamation process and following inscribing (block 602) a second identification code, the test wafer may be reclaimed (block 630) in accordance with the reclamation process identified for that particular test wafer. As previously mentioned, the reclamation process may be selected in a manner, based upon the recorded processing history of the particular test wafer, which not only can increase the efficiency of the reclamation process but also reduce unnecessary thinning of the reclaimed test wafers.

Figure 15:
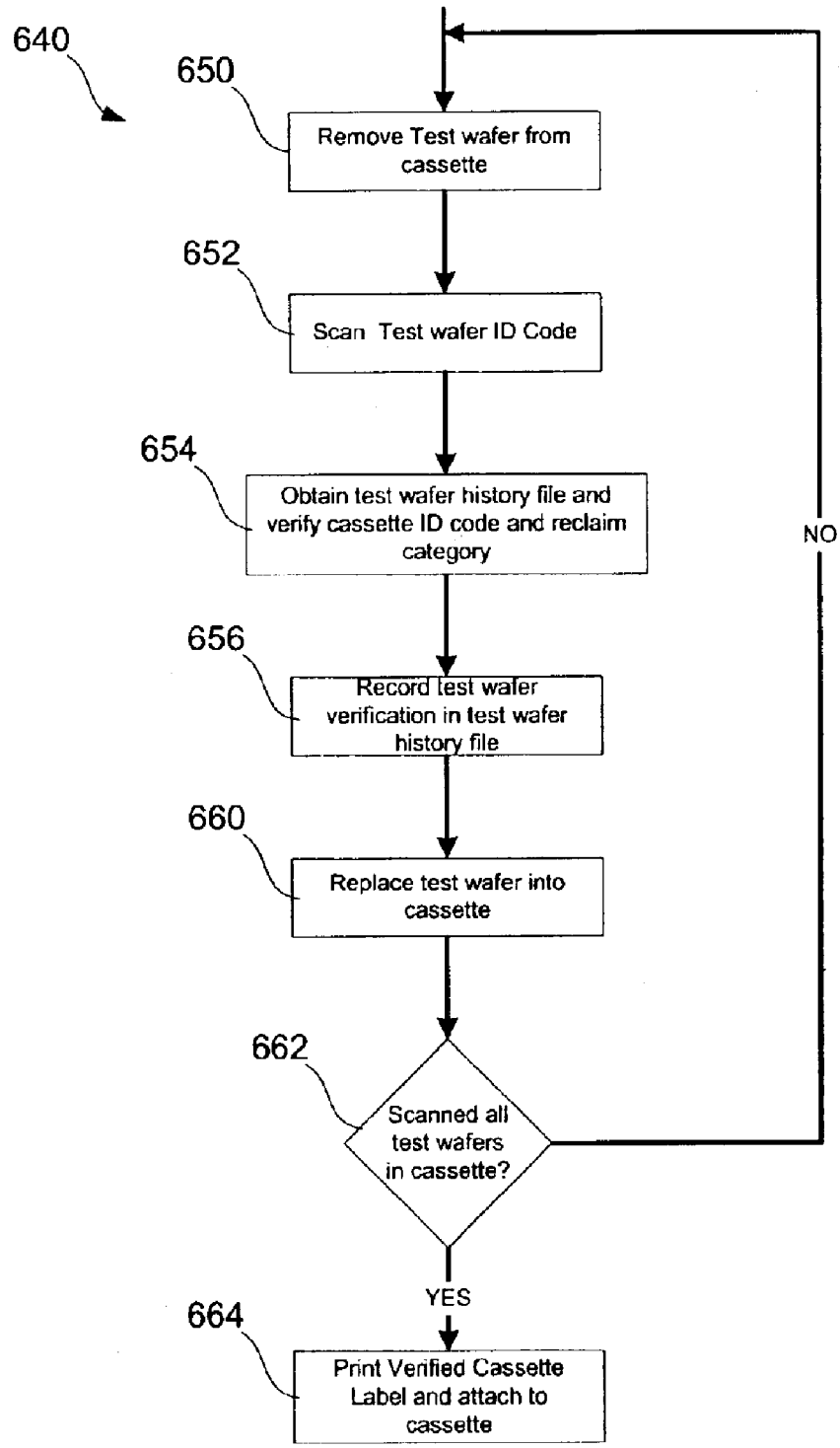
FIG. 15 is a flow chart representing steps by a reclaim supplier to verify test wafer ID's, cassette ID's and reclaim categories.

FIG. 15 shows examples of operations 640 which may be performed by the reclamation operator to verify the identity of each test wafer prior to reclaiming the test wafer. As previously mentioned, the test wafers may be stored in cassettes such as the cassettes 118a . . . 118n in which the test wafers have been sorted by reclamation process type. The reclamation operator may have a computerized system similar to the system 100 illustrated in FIG. 1. To verify that the test wafers have been properly sorted and assigned to the proper reclamation process, the robot 172 removes (block 650) a test wafer from the cassette 118a . . . 118n, a scanner 126 scans (block 652) the test wafer to read the test wafer identification codes inscribed or otherwise placed on the test wafer. Using the test wafer identification code, relevant portions of the test history database 150 transmitted to the reclamation operator may be looked up for that test wafer identification code (field 306, FIG. 4) to obtain the reclamation process (field 392) and cassette (field 472) assigned to that test wafer. The test wafer identification code, reclamation process and cassette identification code of the test wafer may be compared (block 654) to the corresponding information printed on the label 182a . . . 182n attached to the cassette from which the test wafer is withdrawn to confirm that the test wafer was sent to the reclamation operator in the proper cassette with the proper reclamation process identified for that cassette and test wafer. In addition, this information may be compared to that contained in any printed reports such as the wafer ID report (FIG. 8) which may have accompanied the cassettes of test wafers to the reclamation operator.

In some embodiments, it may be desirable to record (block 656) in a database such as the test history database 150 or the cassette database 120 FIG. 3 transmitted to the reclamation processor that it was confirmed that the test wafer was sent to the reclamation operator in the proper cassette with the proper reclamation process identified for that cassette and test wafer. After replacing (block 660) the test wafer, another test wafer may be removed from the cassette and verified as discussed above. Once all (block 662) the test wafers in a cassette have been verified, another label may be printed (block 664) and attached to the cassette indicating that the identifies of the test wafers and the intended reclamation process type have been verified for each test wafer in the cassette. Alternatively, the label such as the label 500 attached to the cassette as shipped to the reclamation operator may be marked to indicate the verification. The remaining cassettes may be verified as described above in connection with FIG. 15.

Following verification, additional identification codes may be inscribed on the cassettes as described above. The test wafers of each verified cassette may then be reclaimed in a manner specified by the label 500 of the cassette or a report accompanying the test wafers. Various reclamation steps are well known to those skilled in the art. In addition, tools for performing reclamation steps are well know those skilled in the art. For example, polishing steps may be performed by an Applied Materials Reflexion tool and cleaning steps may be performed by an Applied Materials Oasis tool. Other tools by Applied Materials, Inc. and other manufacturers for other reclamation processes are known to those skilled in the art as well.

Additional Embodiment Details

The described techniques for reclaiming test wafers and preparing test wafers for reclamation may be implemented as a method, apparatus or article of manufacture using standard programming and/or engineering techniques to produce software, firmware, hardware, or any combination thereof. The term "article of manufacture" as used herein refers to code or logic implemented in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.). Code in the computer readable medium is accessed and executed by a processor. The code in which preferred embodiments are implemented may further be accessible through a transmission media or from a file server over a network. In such cases, the article of manufacture in which the code is implemented may comprise a transmission media, such as a network transmission line, wireless transmission media, signals propagating through space, radio waves, infrared signals, etc. Thus, the "article of manufacture" may comprise the medium in which the code is embodied. Additionally, the "article of manufacture" may comprise a combination of hardware and software components in which the code is embodied, processed, and executed. Of course, those skilled in the art will recognize that many modifications may be made to this configuration without departing from the scope of the present invention, and that the article of manufacture may comprise any information bearing medium known in the art.

In the described implementations, certain aspects of the reclamation preparation and processing are included in a computer to direct handling of the test wafers. In alternative implementations, the reclamation preparation and processing implementations may be implemented using any type of electronic device communicating with other devices, such as a hand held computer, a palm top computer, a laptop computer, a network switch or router, a telephony device, a network appliance, a wireless device, etc.

FIGS. 3, 4, 8, and 14 illustrate certain information maintained in databases stored in computer memory. In alternative implementations, additional or different types of information may be maintained. The illustrated operations of FIGS. 2, 7, 9, 10, 11, 13, and 15 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description.

What is claimed is:

1. A method of reclaiming test substrates used to test semiconductor fabrication tools, comprising:
reading a plurality of test substrate identification data from a plurality of test substrates; and
obtaining from a database, for each read test substrate, stored reclamation process identification data identifying the reclamation process selected to reclaim each read test substrate.

2. The method of claim 1 further comprising sorting said read plurality of test substrates into a plurality of groups, each group of test substrates having associated therewith a common reclamation process selected to reclaim each read test substrate of the group.

3. The method of claim 2 wherein said plurality of groups of said sorting comprises a first group which comprises test substrates having nonmetal depositions and excludes test substrates having metal depositions.

4. The method of claim 3 wherein said plurality of groups of said sorting comprises a second group which consists of test substrates exposed to copper.

5. The method of claim 4 wherein said plurality of groups of said sorting comprises a third group which comprises test substrates having metal deposition and excludes test substrates which have been exposed to copper.

6. The method of claim 2 further comprising reclaiming each read test substrate of each group using the common reclamation selected to reclaim each read test substrate of the group.

7. The method of claim 2 further comprising storing each group of read test substrate in a cassette and labeling the cassette of each group with indicia representing said common reclamation process associated with the group.

8. The method of claim 7 further comprising labeling the cassette of each group with indicia representing the test substrate identification data of each test substrate stored in the cassette of the group.

9. The method of claim 1 wherein said test substrate is fabricated from a material selected from the group consisting of silicon, gallium arsenide, germanium, and glass.

10. The method of claim 1 further comprising reclaiming each read test substrate using the reclamation process selected to reclaim that read test substrate as identified by the stored reclamation process identification data.

11. The method of claim 1 wherein an identified reclamation process includes removing all layers deposited on a test substrate.

12. A method of reclaiming test substrates used to test semiconductor fabrication tools, comprising:

storing into a database, a plurality of test substrate identification data, each test substrate identification data identifying a particular test substrate of a plurality of test substrates;

selecting a reclamation process from a plurality of reclamation processes, for reclaiming each of said plurality of test substrates identified by said plurality of test substrate identification data; and storing into said database, a plurality of test substrate reclamation process identification data, each stored test substrate reclamation process identification data being associated with a stored test substrate identification data wherein each stored test substrate reclamation process identification data identifies the reclamation process selected to reclaim the test substrate identified by the stored test substrate identification data associated with the stored test substrate reclamation process identification data.

13. The method of claim 12 further comprising:

reading test substrate identification data from a test substrate of said plurality of test substrates; and obtaining from said database, stored reclamation process identification data identifying the reclamation process selected to reclaim said read test substrate.

14. The method of claim 13 further comprising storing said read test substrate in a cassette and labeling said cassette with indicia representing said obtained reclamation process identification data.

15. The method of claim 12 further comprising electronically transmitting said database to a reclamation operator.

16. The method of claim 15 wherein said electronically transmitting includes transmitting said database via the Internet.

17. The method of claim 12 further comprising electronically storing said database on removable storage media and sending said removable media to a reclamation operator.

18. The method of claim 12 further comprising:

reading a plurality of test substrate identification data from said plurality of test substrates;

obtaining from said database for each read test substrate, stored reclamation process identification data identifying the reclamation process selected to reclaim each read test substrate; and sorting said read plurality of test substrates into groups, each group of test substrates having associated therewith a common reclamation process selected to reclaim each read test substrate of the group.

19. The method of claim 18 further comprising storing each group of read test substrate in a cassette and labeling the cassette of each group with indicia representing said common reclamation process associated with the group.

20. The method of claim 19 further comprising labeling the cassette of each group with indicia representing the test substrate identification data of each test substrate stored in the cassette of the group.

21. The method of claim 12 wherein an identified reclamation process includes removing all layers deposited on a test substrate.

22. A method of reclaiming test substrates used to test semiconductor fabrication tools, comprising:

reading from a first database a plurality of test substrate identification data, each test substrate identification data identifying a particular test substrate of a plurality of test substrates;

reading from said database process steps performed on each of said plurality of test substrates identified by said plurality of test substrate identification data;

selecting a reclamation process from a plurality of reclamation processes, for reclaiming each of said plurality of test substrates wherein the reclamation process selected for a particular test substrate is a function of the process steps performed on the particular test substrate;

storing into a second database, a plurality of test substrate identification data, each test substrate identification data identifying a particular test substrate of said plurality of test substrates; and storing into said second database, a plurality of test substrate reclamation process identification data, each stored test substrate reclamation process identification data in said second database being associated with a stored test substrate identification data in said second database wherein each stored test substrate reclamation process identification data in said second database identifies the reclamation process selected to reclaim the test substrate identified by the stored test substrate identification data associated with the stored test substrate reclamation process identification data.

23. The method of claim 22 further comprising storing into said second database, data representing said process steps performed on each of said plurality of test substrates identified by said plurality of test substrate identification data.

24. The method of claim 23 further comprising wherein said process steps include material depositions and said data representing said process steps includes data representing the type of material deposited and the thickness of the deposited material in a process step.

25. The method of claim 23 further comprising wherein said process steps include ion implantations and said data representing said process steps includes data representing the type of ion implanted and the depth of the implanted ions in a process step.

26. The method of claim 23 further comprising wherein said process steps include etching, chemical and mechanical polishing and thermal treatments.

27. A method of reclaiming test substrates used to test semiconductor fabrication tools, comprising:

storing into a database, a first plurality of test substrate identification data, each test substrate identification data identifying a particular test substrate of a first plurality of test substrates stored in slots in a first substrate storage container;

storing into said database a first substrate storage container identification data which is associated with said first plurality of test substrate identification data wherein said first substrate storage container identification data identifies the substrate storage container in which said first plurality of test substrates are stored;

selecting a first reclamation process from a plurality of reclamation processes, for reclaiming each of said first plurality of test substrates identified by said first plurality of test substrate identification data; and storing into said database, a first test substrate reclamation process identification data associated with said first plurality of test substrate storage identification data wherein said stored first test substrate reclamation process identification data identifies said first reclamation process selected to reclaim said first plurality of test substrates stored in said first substrate storage container identified by said stored first substrate storage container identification data associated with said stored first test substrate reclamation process identification data.

28. The method of claim 27 further comprising:

storing into said database, a second plurality of test substrate identification data, each test substrate identification data identifying a particular test substrate of a second plurality of test substrates stored in slots in a second substrate storage container;

storing into said database a second substrate storage container identification data which is associated with said second plurality of test substrate identification data wherein said second substrate storage container identification data identifies said second substrate storage container in which said second plurality of test substrates are stored;

selecting a second reclamation process from a plurality of reclamation processes, for reclaiming each of said second plurality of test substrates identified by said second plurality of test substrate identification data; and storing into said database, a second test substrate reclamation process identification data associated with said second plurality of test substrate storage identification data wherein said stored second test substrate reclamation process identification data identifies said second reclamation process selected to reclaim said second plurality of test substrates stored in said second substrate storage container identified by said stored second substrate storage container identification data associated with said stored second test substrate reclamation process identification data.

29. The method of claim 27 further comprising storing a plurality of data representing a slot number wherein each slot number data identifies the slot of the first storage container in which each of said first plurality of test substrates are stored.

30. A system adapted for use with a plurality of test substrates for testing semiconductor fabrication tools wherein each test substrate bears an identification code, comprising:

a plurality of test substrate storage containers, each test storage container being associated with one of a plurality of predetermined reclamation processes;

a robot adapted to transfer a test substrate to a storage container;

a reader adapted to read an identification code from a test substrate; and a controller having a memory adapted to store data representative of the identification code for each test substrate of said plurality of said substrates and data representative of a predetermined reclamation process in association with each stored identification code data for each substrate, said controller being responsive to said reader and adapted to control said robot to transfer a test substrate to a substrate storage container having an associated predetermined reclamation process which matches the predetermined reclamation process associated with the identification code data stored in said controller memory for the test substrate being transferred by said robot.

31. An article of manufacture for reclaiming test substrates used to test semiconductor fabrication tools, wherein the article of manufacture comprises code implemented in a computer readable medium capable of causing a processor to perform:

storing into a database, a plurality of test substrate identification data, each test substrate identification data identifying a particular test substrate of a plurality of test substrates;

selecting a reclamation process from a plurality of reclamation processes, for reclaiming each of said plurality of test substrates identified by said plurality of test substrate identification data; and storing into said database, a plurality of test substrate reclamation process identification data, each stored test substrate reclamation process identification data being associated with a stored test substrate identification data wherein each stored test substrate reclamation process identification data identifies the reclamation process selected to reclaim the test substrate identified by the stored test substrate identification data associated with the stored test substrate reclamation process identification data.

32. The article of claim 31 wherein an identified reclamation process includes removing all layers deposited on a test substrate.

33. A computer readable medium including a computer database of data, for reclaiming test substrates used to test semiconductor fabrication tool, comprising:

a plurality of test substrate identification data, each test substrate identification data identifying a particular test substrate of a plurality of test substrates; and a plurality of test substrate reclamation process identification data, each test substrate reclamation process identification data being associated with a test substrate identification data wherein each stored test substrate reclamation process identification data identifies a reclamation process selected to reclaim the test substrate identified by the test substrate identification data associated with the test substrate reclamation process identification data.

34. The medium of claim 33 wherein an identified reclamation process includes removing all layers deposited on a test substrate.

35. A test device for testing processing steps performed by semiconductor fabrication tools, comprising:

a test substrate having first identification indicia representing a first identification code, and second identification indicia representing reclamation data for said test substrate.

36. The test device of claim 35 wherein said second identification indicia are laser inscribed.

37. The test device of claim 35 wherein said second identification indicia represent a reclamation category selected from reclamation categories which include a copper reclamation category.

38. The test device of claim 35 wherein said second identification indicia represent a reclamation process to which the test substrate is to be subjected, and wherein the reclamation process includes removing all layers deposited on a test substrate.

* * * * *